(12) United States Patent
Jennings

(10) Patent No.: US 6,360,295 B1
(45) Date of Patent: Mar. 19, 2002

(54) SERIALLY LOADABLE DIGITAL ELECTRONIC MEMORY AND METHOD OF LOADING THE SAME

(75) Inventor: Kevin F. Jennings, Novi, MI (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/406,974

(22) Filed: Sep. 28, 1999

Related U.S. Application Data

(60) Provisional application No. 60/101,985, filed on Sep. 28, 1998.

(51) Int. Cl.⁷ ............................................... G06F 12/02
(52) U.S. Cl. ....................................................... 711/105
(58) Field of Search ................................ 711/104, 105, 711/109

(56) References Cited

U.S. PATENT DOCUMENTS

| | | | |
|---|---|---|---|
| 4,541,075 A | * | 9/1985 | Dill et al. .................... 365/189 |
| 4,811,295 A | * | 3/1989 | Shinoda ....................... 365/189 |
| 5,864,568 A | * | 1/1999 | Memazie .................... 371/40.14 |

OTHER PUBLICATIONS

XILINX Product Specification (Sep. 17, 1999).
Lattice Semiconductor Webpage (Printed Sep. 27, 1999).

* cited by examiner

Primary Examiner—Nevin L. Ellis
(74) Attorney, Agent, or Firm—Mark T. Starr

(57) ABSTRACT

A serial load controller and method for loading at least one input data bit serially into a memory. The memory is interfaced to a data bus and an address bus. The serial load controller includes a counter generating an internal address pointer signal in response to a first control signal. The first control signal indicates that the input data bit is to be transferred serially into the memory. The counter is responsive to the first control signal to reset the internal address pointer to an initial value. A multiplexer is coupled to select one of the address bus and the internal address pointer signal as an output address bus in response to the first control signal. Suitable transceivers or other bus drivers are provided for driving at least a first input data bit onto the data bus in response to the clock pulse.

16 Claims, 4 Drawing Sheets

SERIALLY LOADABLE DIGITAL ELECTRONIC MEMORY AND METHOD OF LOADING THE SAME

This application claims benefit to provisional No. 60/101,985 filed Sep. 28, 1998.

BACKGROUND

Frequently in the design of high speed electronic printed circuit boards there is a need to use a memory device as some sort of 'hardware look up table'. This look up table sometimes contains the result of some mathematical computation that is pre-computed for all possible input values. This look up table technique is commonly used both in hardware and in software as a mechanism to improve some metric of system performance. The performance improvement results because, while the system is processing data, the system processor need not commit resources to performing the mathematical computation since the results have already been pre-computed and stored in the lookup table.

In the particular case of a hardware implementation of the look up table, it is frequently found that this lookup table is generally not accessible to a conventional processor in that the memory implementing the look up table is not interfaced to the processor's address, data, and control busses. Making the memory constituting the look up table accessible to the processor generally requires the addition of several components because now access to the memory device must be shared between the processor (for table loading) and the normal input data stream (for data processing).

FIG. 1 is a diagram of a conventional computer system 10 featuring the interface between a memory 15 and a CPU 11. The memory device 15 hosts the look up table discussed above. All the other devices shown in FIG. 1 are the additional parts, or overhead, necessary to allow a CPU/processor to access the memory. The transceivers 14 allow the processor to access the address and data pins of memory device 15 over address bud 12 and data bus 13. If there are multiple such memory devices 15, in general there will be a set of transceivers 14 for each memory device 15. Even in the case of a single memory device 15, there is considerable overhead in terms of additional parts that is associated with allowing a CPU 11 to access the memory 15.

Another approach that could be used if providing access to a conventional processor is not possible or if there happens to be no conventional processor even available in the system is to use conventional 'read only' memory (ROM). ROM devices are non-volatile in that they retain data when power is turned off, and typically are programmed only once before the device is assembled onto the printed circuit board.

A second application where it may be desirable to have serially loadable memory is one where a processor has access to non-volatile but re-writable memory which is critical to being able to bring the system that contains the processor into an operational state. An example of such memory would be the BIOS memory on a conventional personal computer. One of the functions of the BIOS memory is to contain 'boot code' which is a program that the processor reads from BIOS memory and executes upon receipt of a system start or reset. Obviously corruption of this program could cause the computer to be unable to be brought up into a functional state. However, if this program is contained in non-volatile but re-writable memory, as is generally the case with modern personal computers, then there is a chance that an errant or malicious software program could overwrite this critical memory area. Although there are several mechanisms available to make this scenario less probable, the only fail-safe way to both have the advantages of re-writable non-volatile memory without the risk of having an unbootable system is to have a separate non-volatile but not writable memory device which contains a boot code program that can be used as an emergency boot device if the normal boot memory device gets corrupted. This however requires a second physical memory device to be installed in the system. However, not providing a second read only memory device adds some risk to the system. Providing access to a serially loadable memory device, in certain circumstances, would be a more cost effective solution. For a further discussion on the comparative advantages of this invention refer to the section titled "Advantages of this Invention over Current Practice".

SUMMARY OF THE DISCLOSURE

The invention provides a serial load controller for loading at least one input data bit serially into a memory. The memory is interfaced to a data bus and an address bus. The serial load controller includes a counter generating an internal address pointer signal in response to a first control signal. The first control signal indicates that the input data bit is to be transferred serially into the memory. The counter is responsive to the first control signal to reset the internal address pointer to an initial value. A multiplexer is coupled to select one of the address bus and the internal address pointer signal as an output address bus in response to the first control signal. Means, such as suitable transceiver or other bus driver, are provided for driving at least a first data bit onto the data bus in response to the clock pulse.

BRIEF DESCRIPTION OF THE DRAWING FIGURES

DETAILED DESCRIPTION OF ILLUSTRATIVE EMBODIMENTS

Overview of the Invention

Figure 2:
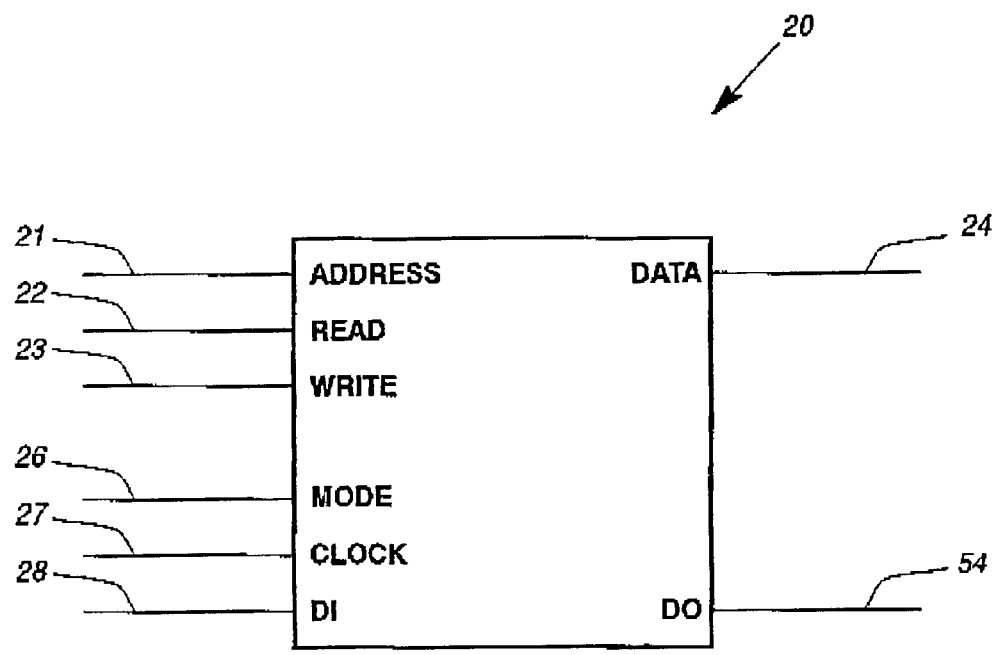
FIG. 2 is a high-level diagram of a serially loadable memory system constructed according to an embodiment of the invention.

FIG. 2 is a high-level diagram of a serially loadable memory system constructed according to an embodiment of the invention. FIG. 2 illustrates serially-loadable memory system 20, and the signals flowing into and out of the system 20. All of these signals, both new and conventional, are summarized in Table 1 below. The conventional memory interface signals are the input ADDRESS bus signals 21, the DATA bus 54, the input READ signal 22, and the input WRITE signal 23. These conventional signals are used in the same manner on a memory device whether the memory device incorporates the invention or not. Also, the invention can be applied to both read/write (random access) memory as well as to read only memory. For read only memory, there would be no input WRITE signal 23. The new signals defined by this invention are the input MODE signal 26, the input CLOCK signal 27, the input DI signal 28, and the output DO signal 25.

TABLE 1

| Signal Name | Definition |
|---|---|
| Address | Conventional memory device address input |
| Data | Conventional memory device data input/output |
| Read | Conventional memory device read command |
| Write | Conventional memory device write command |
| MODE | Used to control serial access to the memory device. |
| CLOCK | Used to sample the input signals MODE and DI in order to provide serial access to the memory device. |
| DI | Data In signal. Used to serially shift in data to the memory device. |
| DO | Data Out. Output signal used to allow multiple memory devices to be daisy chained together. |

Figure 3:
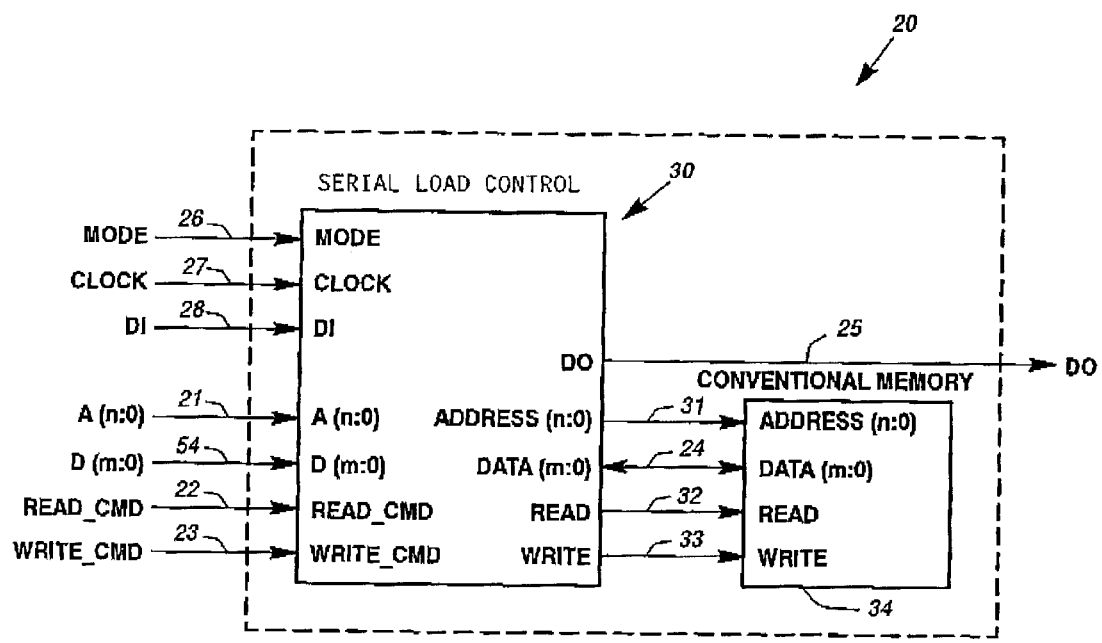
FIG. 3 is a more detailed diagram of the serially loadable memory system illustrated in FIG. 2.

FIG. 3 is a more detailed diagram of the serially loadable memory system illustrated in FIG. 2. Specifically, the serially loadable memory 20 is broken into serial load controller 30 and conventional memory 34. The serial load controller 30 receives as input a conventional n-bit ADDR bus 21, a conventional m-bit bi-directional DATA bus 24, a conventional read command READ_CMD 22, and a conventional write command WRITE_CMD 23. The serial load controller 30 also receives as input a MODE signal 26, a CLOCK signal 27, and a DI signal 28, which signals are not conventional and are defined by the invention. The serial load controller 30 generates as output an n-bit ADDRESS bus 31, an m-bit bi-directional DATA bus 24, a READ signal 32, a WRITE signal 33, and routes these outputs to as data, address, and control busses to conventional memory 34. The serial load controller 30 also generates as output a DO signal 25, which can be routed to a cascaded serially loadable memory 20 as a corresponding serial output DI signal 28 as described in further detail below. The serially loadable memory 20 converts between the desired serial interface and the physical memory device interface.

Figure 4:
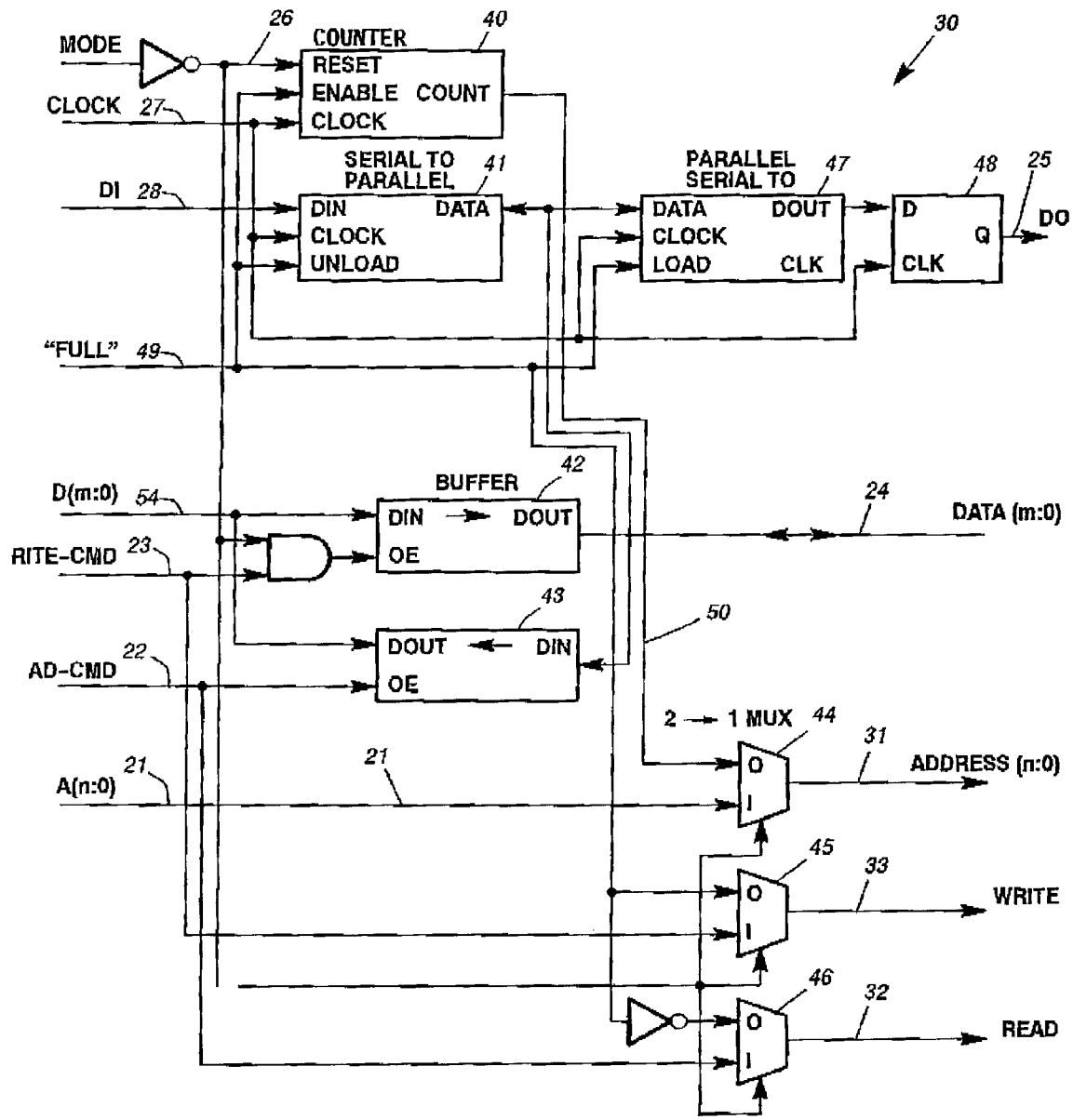
FIG. 4 is a hardware diagram of the serial load controller shown in FIG. 3.

Turning briefly to FIG. 4, a hardware diagram of the serial load controller 30 shown in FIG. 3, the MODE signal 26, when it transitions from the inactive state to the active state at the rising edge of CLOCK 27, would cause an internal memory address pointer in internal address bus 50 output from the counter 40 to reset to some known state, for example all zeros. This internal address pointer has as many bits as the conventional ADDR input signal 21. Thereafter, as long as the MODE signal 26 is active, the rising edge of the CLOCK signal 27 would be used to sample the data input signal DI 28. The sampled data would then be written to the selected bit of the memory location pointed to by the internal address pointer on bus 50.

The signal shown as FULL signal 49 is a design specific signal. It is used to indicate how wide the memory data core is and thus how wide the serial to parallel converter 41 and the parallel to serial converter 47 are. If it is assumed that individual memory cells can be written on an individual bit basis, then the serial to parallel and the parallel to serial converters 41 and 47 would not even be required and the FULL signal 49 would be true for every clock cycle. However, most conventional memory is 8 or 16 bits wide. In the case of 8-bit wide memory, the serial to parallel converter 41 would convert a single bit input to an 8 bit wide output. This would be output onto the memory DATA bus 24 when the FULL signal 49 is true. The parallel to serial converter 47 would convert 8-bit wide input into a 1 bit wide output when the FULL signal is true. The FULL signal 49 would go active once every 8 clock cycles.

Once the serial to parallel converter 41 is full (as indicated by the FULL signal 49 being true) the outputs of the serial to parallel converter 41 would be written to the selected memory location pointed to by the internal address pointer on bus 50. Prior to writing the data, the previous contents of that memory location would be sampled into the parallel to serial converter 47. This sampled data would then be shifted out of the parallel to serial converter 47 on each edge of the CLOCK signal 27 and finally resynchronized to the falling edge of the CLOCK signal 27. Finally, the sampled data is output as the DO signal 25 which would remain stable until the subsequent falling edge of the CLOCK signal 27. The memory device would then return to conventional operation when the MODE signal 26 is returned to the inactive state.

Since the previous contents of the memory location are saved prior to overwriting and subsequently output on the DO output signal 25, the memory device now appears to act as a long shift register. Multiple similar memory devices can thus be cascaded by connecting the DO output 25 of one memory device to the DI input 28 of the next memory device to form an even larger shift register. From the perspective of a printed circuit board containing such memory devices 30, an arbitrarily large number of such memory devices could be connected. The printed circuit board would only need to provide access to a single four-wire interface, since the DO output 25 from the final serial memory device 30 is the only output that needs to be fed back out. By providing a connector or other mechanism on the printed circuit board to access and control these four signals, it is possible to program any number of serially loadable memory devices 30.

As an example, a memory device that is 256 address locations deep and 8 bits wide would be completely written on 256×8 (or 2048) CLOCK cycles and could be written as shown in Table 2 below:

TABLE 2

| Clock Cycle # | Internal Address Pointer | Action |
|---|---|---|
| 1 | 0 | Sample existing contents of address location 0 bit 0 and save for output on falling edge of CLOCK. Overwrite contents of address location 0 bit 0 with current value of DI input signal as sampled at the rising edge of clock. |
| 2 | 0 | Sample existing contents of address location 0 bit 1 and save for output on falling edge of CLOCK. Overwrite contents of address location 0 bit 1 with current value of DI input signal as sampled at the rising edge of clock. |
| 3 | 0 | Sample existing contents of address location 0 bit 2 and save for output on falling edge of CLOCK. Overwrite contents of address location 0 bit 2 with current value of DI input signal as sampled at the rising edge of clock. |
| 4 | 0 | Sample existing contents of address location 0 bit 3 and save for output on falling edge of CLOCK. Overwrite contents of address location 0 bit 3 with current value of DI input signal as sampled at the rising edge of clock. |
| 5 | 0 | Sample existing contents of address location 0 bit 4 and save for output on falling edge of CLOCK. Overwrite contents of address location 0 bit 4 with current value of DI input signal as sampled at the rising edge of clock. |
| 6 | 0 | Sample existing contents of address location 0 bit 5 and save for output on falling edge of CLOCK. Cverwrite contents of address location 0 bit 5 with current value of DI input signal as sampled at the rising edge of clock. |
| 7 | 0 | Sample existing contents of address location 0 bit 6 and save for output on falling edge of CLOCK. Overwrite contents of address location 0 bit 6 with |

TABLE 2-continued

| Clock Cycle # | Internal Address Pointer | Action |
|---|---|---|
| | | current value of DI input signal as sampled at the rising edge of clock. |
| 8 | 0 | Sample existing contents of address location 0 bit 7 and save for output on falling edge of CLOCK. Overwrite contents of address location 0 bit 7 with current value of DI input signal as sampled at the rising edge of clock. |
| 9 | 1 | Sample existing contents of address location 1 bit 0 and save for output on falling edge of CLOCK. Overwrite contents of address location 1 bit 0 with current value of DI input signal as sampled at the rising edge of clock. |
| Etc. 2048 | Etc. 255 | Etc. Sample existing contents of address location 255 bit 7 and save for output on falling edge of CLOCK. Overwrite contents of address location 255 bit 7 with current value of DI input signal as sampled at the rising edge of clock. |

Hardware Description

The invention provides a serial load controller 30 for loading a plurality of input data bits serially into a memory 34 (see FIG. 3). The memory is interfaced to a data bus 24 that is D bits wide and is interfaced to an address bus 31 that is A bits wide. In an illustrative but not limiting embodiment, the serial load controller 30 includes the following. A counter 40 generates as an output an internal address pointer signal on bus 50 in response to a MODE control signal 26. The MODE control signal 26 is generated externally to the serial load controller 30, and indicates that the input data bits are to be transferred serially into the memory. The internal address pointer signal on bus 50 is A bits wide to match the width of the system address busses 21 and 31. The counter 40 is responsive to the MODE control signal 26 to reset the internal address pointer on bus 50 to an initial value, such as all zeros or some other initial memory address associated with the serial load controller 30. The counter 40 is also responsive to a pulse from an input CLOCK signal 27 to increment the internal address pointer on bus 50 as necessary to write additional bits, bytes, or words into the memory.

A first multiplexer 44 is coupled to select one of the input address bus 21 and the internal address pointer signal on bus 50 as an output address bus 31 in response to the MODE control signal 26. The multiplexer 44 operates in one of two modes. In a "pass-through" mode, the serial load controller 30 is essentially transparent to the rest of the system, and the multiplexer 44 functions to pass through or forward the address bus signals 21 input from the system on to the memory 34 as output address bus 31. Conversely, in a "serial load" mode, the serial load controller 30 generates its own address bus signals on bus 50 and the multiplexer 44 drives them onto the output address bus 31. When the MODE signal 26 is inactive, the multiplexer 44 is in pass-through mode. When the MODE signal 26 is active, the multiplexer 44 drives the internal address pointer signal on bus 50 through as the output address bus 31.

When the serial load controller 30 is interfaced to a data bus 24 that is more than one bit wide, a serial to parallel converter 41 is coupled to convert the input data bits from the DI signal 28 into a plurality of output parallel bits, and also drives these output parallel bits onto the data bus 24. The serial to parallel converter 41 is also coupled to a system clock signal 27 to clock-in one of the input data bits in response to each clock pulse. In an illustrative but not limiting embodiment, the serial to parallel converter 41 clocks-in the bits on the rising edge of the clock pulse. Means, such as an additional counter, (not shown) can be provided for generating an additional control signal, such as the FULL signal 49, indicating that D input data bits have been clocked-into the serial to parallel converter 41. The FULL signal 49 indicates that the serial to parallel converter 41 has clocked-in and converted to parallel a complete word (D-bits wide) that is ready to be written to the memory address pointed to by the internal address pointer signal on bus 50.

A first buffer 42 is coupled to drive the data bus 24 in response to a write command signal 23 from the external control bus and the MODE signal 26. A second buffer 43 is coupled to latch data from the data bus 24 in response to a read command signal 22 from the external control bus. This data is then output on to system data bus 54.

In some applications of the invention, it may be desired to output the current contents of a given memory location before that location is overwritten with the input serial bits. In such cases, a parallel to serial converter 47 is coupled to sample a current content of the memory location pointed to by the internal address pointer signal on bus 50 in response to the FULL signal 49. The parallel to serial converter 47 converts the sampled plurality of parallel bits into a plurality of serial output bits, and clocks-out one of the serial output bits in response to each clock pulse. In an illustrative embodiment but not limiting of the invention, the parallel to serial converter 47 clocks-out on the rising edge of the clock pulses. A flip-flop 48 is coupled to receive the serial output bits from the parallel to serial converter 47 in response to each clock pulse, and is coupled to output the serial output bit on the DO pin 25. In an illustrative embodiment of the invention, the flip-flop 48 outputs the bits on a falling edge of the clock pulses.

A second multiplexer 45 is coupled to select one of the FULL signal 49 and the write command signal 23 as an output write control signal 33 in response to the MODE signal 26. When the MODE signal 26 is active, the FULL signal 49 is passed through the second multiplexer 45 as the write command signal 33 sent to the memory 34. When MODE is inactive, the WRITE command signal 23 is passed through the second multiplexer 45 as the write command signal 33 sent to the memory 34.

A third multiplexer 46 is coupled to select one of an inverted version of the FULL signal 49 and the read command signal 22 as an output read command signal 32 in response to the MODE signal 26. When the MODE signal 26 is active, the inverted form of the FULL signal 49 is passed through the third multiplexer 46 as the read command signal 32 sent to the memory 34. When the MODE signal 26 is inactive, the READ command signal 22 is passed through the third multiplexer 46 as the read command signal 32 sent to the memory 34.

Method of Operation

The invention provides a method of loading at least one serial data bit to a memory 34 (FIG. 3) that is interfaced to a parallel data bus 24 and an address bus 31. In an illustrative but not limiting embodiment of the invention, the method comprising the following steps when the invention is used to serially load data into a memory 34 interfaced to a data bus 24 that is one bit wide. A MODE signal 26 is asserted that indicates that the at least one data bit is to be written to the memory 34. In response to the MODE signal 26, an internal address pointer signal is generated on bus 50 that specifies where in the memory 34 that the at least one data bit is to be written. The internal address pointer signal on bus 50 is typically reset to an initial value, such as all zeros or to some other starting address as appropriate in a given application, in response to the MODE signal 26. The internal address pointer signals on bus 50, rather than the input address bus signals on bus 21, are driven onto an output address bus 31 in response to the MODE signal 26. The at least one data bit is sampled from the DI input signal 28 in response to a CLOCK signal 27. In an illustrative but not limiting embodiment of the invention, the sampling of the at least one serial data bit is done on a rising edge of the CLOCK signal 27. Finally, the at least one data bit is driven onto the data bus 24, from which it is written to the memory 34 at the address pointed-to by the internal address pointer signal on bus 50. After the data bit is written to the memory 34, the internal address pointer signal on bus 50 is incremented in response to a pulse of the CLOCK signal 27.

Where the invention is used to serially load data into a memory 34 interfaced to a data bus 24 being several bits wide, the step of sampling includes sampling a plurality of input serial data bits in sequence from the DI input signal 28. These input serial data bits are converted into a corresponding plurality of parallel data bits, such as by the serial to parallel converter 41. During the conversion process, each one of the plurality of serial data bits are clocked-in into the serial to parallel converter 41 in response to a clock signal 27. In addition, a FULL signal 49, which indicates that D input data bits have been clocked-into the serial to parallel converter 41, is generated. D is an integer representing the number of bits in the data bus 24. In response to the FULL signal 49, the plurality of parallel data bits are driven onto the data bus 24 to the address indicated by the internal address pointer signal on bus 50. As discussed above, the FULL signal 49 can be generated by a counter (not shown) coupled to count the pulses from the input CLOCK signal 27. After the data bit is written to the memory 34, the internal address pointer signal on bus 50 is incremented to point to the next sequential memory address.

In a further illustrative embodiment of the invention, the current contents of the address in the memory 34 pointed to by the internal address pointer signal on bus 50 can be sampled before driving the at least one data bit onto the data bus 24. In this manner, the current contents can be saved-off before the contents are overwritten, and can be shifted out to another piece of hardware, if necessary. The current contents can be converted from a plurality of parallel bits to a plurality of serial output bits before they are shifted out sequentially, utilizing for example the parallel to serial converter 47 and the flip-flop 48, as described in the hardware description above. In an illustrative embodiment of the invention, each one of the serial output bits can be clocked out in response to a falling edge of the CLOCK signal 27.

Functional Advantages of the Invention

A four signal interface, comprising the MODE, CLOCK, DI, and DO signals, is all that is required to program any number of serially loadable memory devices. This interface can be used in several manners:

Brought out to a printed circuit board connector. If the serially loadable memory device is non-volatile, this would provide a convenient mechanism for occasional updates to the non-volatile memory data pattern as well as providing a 'fail-safe' way of recovering from an unintended overwrite of critical memory.

Brought out to a processor or other logic interface. If the serially loadable memory devices are volatile, then they will need to be loaded with a data pattern upon power up. The data pattern to be loaded could be stored in some other non-volatile memory device which, after power up, would then be transferred to the volatile serial memory devices. While it might seem odd to store one memory devices data pattern in yet another memory device there are several practical reasons that one may want to do so. Two common example are system performance and memory size limitations. The volatile memory device which is used to perform some system lookup table function may need to operate at a very high speed whereas the actual loading of the table may not have such a requirement since it might only need to be done upon system restart. In this instance a lower speed serial interface used for loading and a high speed conventional parallel interface may provide the most cost effective approach. Also, if one of a set of tables must occasionally be switched between, both tables may be stored in a lower cost, lower performance non-volatile memory device and the system may simply select which table to load.

Figure 1:
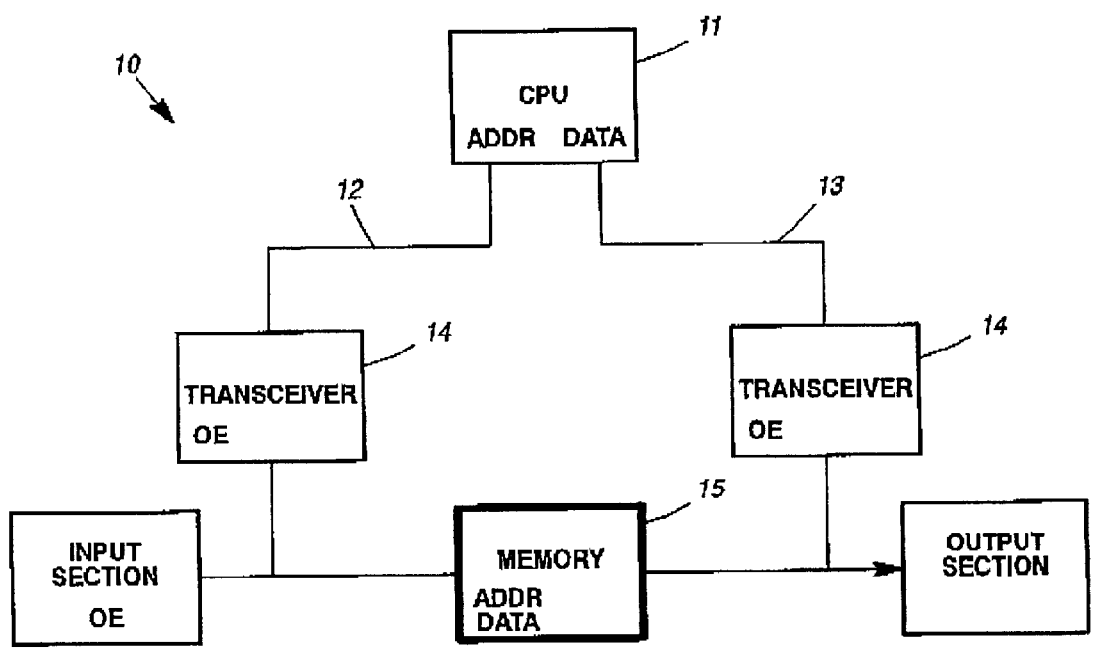
FIG. 1 is a diagram of a conventional interface between a memory and a CPU.

This invention provides several advantages over current memory devices that do not have a serial load capability. Some of these advantages are:

Provides a simpler approach to loading embedded memory that is not otherwise readily accessible to a processor. As shown in FIG. 1, there can be more overhead associated with providing access to an embedded memory then there is more for the memory itself whereas a serially loadable memory device only requires at most a four pin connector. Furthermore, if there are several such embedded memory devices all connected to different input and output signals, then each such memory device would require a set of buffers and transceivers in order to provide process access. Using serially loadable memory devices would only require the same four signal interface independent of how many memory devices there are and how they are connected. In many instances, this will take up much less space and cost less than the various buffers and transceivers that would otherwise be required as shown in FIG. 1.

Serially loadable memory devices are capable of being loaded even if there is no built in processor available in the system.

If a typical non-volatile memory device is programmed incorrectly, the device must be physically removed, reprogrammed and replaced in order to repair the printed circuit board. Using serially loadable non-volatile memory and a four pin connector it is possible to program the memory device correctly without having to remove the device from the printed circuit board.

Typical non-volatile memory devices available today are generally slower than read/write memory of the same capacity. They also require additional handling since they must be programmed prior to being assembled on to a printed circuit board. By using serially loadable read/write memory devices that are loaded at power up from a slower read only non-volatile memory device, a higher performance circuit may be able to be realized.

In the case where non-volatile writable memory is used to hold critical program memory necessary to 'boot' the system up into a functional state, using serially loadable non-volatile writable memory provides a 'fail-safe' way of easily repairing a printed circuit board that has had this critical memory area corrupted.

It is understood that changes may be made to the illustrative embodiments described above without departing from the broad inventive concepts thereof. Accordingly, the present invention is not limited to the particular embodiments disclosed, but is intended to cover all modifications and embodiments that are within the spirit and scope of the invention as defined by the appended claims.

I claim:

1. A serial load controller for loading a plurality of input data bits serially into a memory, the memory being interfaced to a data bus and being interfaced to an address bus, the serial load controller comprising:

a counter generating an internal address pointer signal in response to a first control signal indicating that the input data bits are to be transferred serially into the memory, the counter being responsive to the first control signal to reset the internal address pointer to an initial value;

a multiplexer coupled to select one of the address bus and the internal address pointer signal as an output address bus in response to the first control signal, whereby the multiplexer passes the address bus through as the output address bus when the first control signal is inactive and passes the internal address pointer signal through as the output address bus when the first control signal is active; and means for driving at least a first one of the plurality of input data bits onto the data bus in response to the clock pulse.

2. The serial load controller of claim 1, wherein the counter is responsive to a clock pulse to increment the internal address pointer.

3. The serial load controller of claim 1, wherein the driving means includes:

a serial to parallel converter coupled to convert a plurality of input data bits into a plurality of parallel bits and to drive the parallel bits onto the data bus, the serial to parallel converter coupled to clock-in one of the input data bits in response to a rising edge of each clock pulse; and means for generating a second control signal indicating that D input data bits have been clocked-into the serial to parallel converter, where D is an integer representing a number of parallel bits in the data bus.

4. The serial load controller of claim 2, further comprising a parallel to serial converter coupled to sample a current content of a memory location pointed to by the internal address pointer signal in response to the second control signal and to convert the plurality of parallel bits into a plurality of serial output bits, the parallel to serial converter coupled to clock-out one of the serial output bits in response to a rising edge of each clock pulse; and further comprising a flip-flop coupled to receive one of the serial output bits from the parallel to serial converter in response to a falling edge of each clock pulse, and coupled to output the serial output bit.

5. The serial load controller of claim 2, further comprising a first buffer coupled to drive the data bus in response to a write command signal and the first control signal; and further comprising a second buffer coupled to latch data from the data bus in response to a read command signal.

6. The serial load controller of claim 3, further comprising a second multiplexer coupled to select one of the second control signal and the write command signal as an output write command signal in response to the first control signal; and further comprising a third multiplexer coupled to select one of an inversion of the second control signal and the read command signal as an output read command signal in response to the first control signal.

7. A serial load controller for loading a plurality of input data bits serially into a memory, the memory being interfaced to a data bus being D bits wide and being interfaced to an address bus being A bits wide, the serial load controller comprising:

a counter generating an internal address pointer signal in response to a first control signal indicating that the input data bits are to be transferred serially into the memory, the internal address pointer signal being A bits wide, the counter being responsive to the first control signal to reset the internal address pointer to an initial value, the counter being responsive to a clock pulse to increment the internal address pointer;

a first multiplexer coupled to select one of the address bus and the internal address pointer signal as an output address bus in response to the first control signal, whereby the first multiplexer passes the address bus through as the output address bus when the first control signal is inactive and passes the internal address pointer signal through as the output address bus when the first control signal is active;

a serial to parallel converter coupled to convert the input data bits into a plurality of parallel bits and to drive the parallel bits onto the data bus, the serial to parallel converter coupled to clock-in one of the input data bits in response to a rising edge of each clock pulse;

means for generating a second control signal indicating that D input data bits have been clocked-into the serial to parallel converter;

a first buffer coupled to drive the data bus in response to a write command signal and the first control signal;

a second buffer coupled to latch data from the data bus in response to a read command signal;

a parallel to serial converter coupled to sample a current content of a memory location pointed to by the internal address pointer signal in response to the second control signal and to convert the plurality of parallel bits into a plurality of serial output bits, the parallel to serial converter coupled to clock-out one of the serial output bits in response to a rising edge of each clock pulse;

a flip-flop coupled to receive one of the serial output bits from the parallel to serial converter in response to a falling edge of each clock pulse, and coupled to output the serial output bit;

a second multiplexer coupled to select one of the second control signal and the write command signal as an output write command signal in response to the first control signal; and a third multiplexer coupled to select one of an inversion of the second control signal and the read command signal as an output read command signal in response to the first control signal.

8. A method of loading at least one data bit into a memory being interfaced to a parallel data bus and to an input address bus, the method comprising the steps of:

asserting a control signal indicating that the at least one data bit is to be written to the memory;

generating an internal address pointer signal in response to the control signal, the internal address pointer specifying where in the memory the at least one data bit is to be written;

driving the internal address pointer signal rather than the input address bus as an output address bus in response to the control signal;

sampling the at least one data bit in response to a clock signal; and driving the at least one data bit onto the data bus.

9. The method of claim 8, wherein the step of generating includes resetting the internal address pointer signal to an initial value in response to the control signal.

10. The method of claim 8, further comprising the step of incrementing the internal address pointer signal in response to a clock pulse.

11. The method of claim 8, wherein the step of sampling includes sampling a plurality of serial data bits, and further comprising the step of converting the plurality of serial data bits into a plurality of parallel data bits, and wherein the step of driving the at least one data bit includes driving the plurality of parallel data bits onto the data bus.

12. The method of claim 11, wherein the step of converting includes clocking-in each one of the plurality of serial data bits into a serial to parallel converter in response to a clock signal, and further comprising the step of generating a second control signal indicating that D input data bits have been clocked-into the serial to parallel converter, where D is an integer representing the number of bits in the data bus.

13. The method of claim 8, further comprising the step of sampling a current content of the memory address pointed to by the internal address pointer signal before driving the at least one serial data bit onto the data bus.

14. The method of claim 8, further comprising the step of converting the current content of the memory address from a plurality of parallel bits to a plurality of serial output bits.

15. The method of claim 14, further comprising the step of clocking out each one of the serial output bits in response to a falling edge of the clock signal.

16. The method of claim 8, wherein the step of sampling includes sampling the at least one serial data bit on a rising edge of the clock signal.

* * * * *